United States Patent
Lee et al.

(10) Patent No.: US 9,087,971 B2
(45) Date of Patent: *Jul. 21, 2015

(54) LIGHT-EMITTING DEVICE HAVING DIELECTRIC REFLECTOR AND METHOD OF MANUFACTURING THE SAME

(71) Applicant: SAMSUNG ELECTRONICS CO., LTD., Suwon-Si, Gyeonggi-do (KR)

(72) Inventors: Dong-Hoon Lee, Seoul (KR); Geon-Wook Yoo, Seongnam-Si (KR); Nam-Goo Cha, Ansan-Si (KR); Kyung-Wook Hwang, Hwaseong-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/473,709

(22) Filed: Aug. 29, 2014

(65) Prior Publication Data

US 2014/0367727 A1 Dec. 18, 2014

Related U.S. Application Data

(63) Continuation of application No. 13/873,688, filed on Apr. 30, 2013, now Pat. No. 8,847,265.

(30) Foreign Application Priority Data

Jun. 25, 2012 (KR) .................. 10-2012-0068171

(51) Int. Cl.
*H01L 33/00* (2010.01)
*H01L 33/60* (2010.01)
(Continued)

(52) U.S. Cl.
CPC .............. *H01L 33/60* (2013.01); *H01L 27/15* (2013.01); *H01L 33/14* (2013.01); *H01L 33/24* (2013.01);
(Continued)

(58) Field of Classification Search
CPC ......... H01L 33/60; H01L 33/04; H01L 33/08; H01L 33/14; H01L 33/24
USPC ...................................................... 257/98, 91
See application file for complete search history.

(56) References Cited

U.S. PATENT DOCUMENTS 6,372,608 B1    4/2002    Shimoda et al.
6,645,830 B2    11/2003    Shimoda et al.
(Continued)

FOREIGN PATENT DOCUMENTS

JP    2009-505415 A    2/2009
JP    2009-152474 A    7/2009
(Continued)

OTHER PUBLICATIONS

United States Notice of Allowance issued in U.S. Appl. No. 13/873,688 dated May 29, 2014.

*Primary Examiner* — Tu-Tu Ho
(74) *Attorney, Agent, or Firm* — McDermott Will & Emery LLP

(57) ABSTRACT

A light-emitting device includes a first conductive semiconductor layer formed on a substrate, a mask layer formed on the first conductive semiconductor layer and having a plurality of holes, a plurality of vertical light-emitting structures vertically grown on the first conductive semiconductor layer through the plurality of holes, a current diffusion layer surrounding the plurality of vertical light-emitting structures on the first conductive semiconductor layer, and a dielectric reflector filling a space between the plurality of vertical light-emitting structures on the current diffusion layer.

10 Claims, 11 Drawing Sheets

(51) Int. Cl.
*H01L 27/15* (2006.01)
*H01L 33/14* (2010.01)
*H01L 33/24* (2010.01)
*H01L 33/46* (2010.01)
*B82Y 20/00* (2011.01)
*H01L 33/08* (2010.01)

(52) U.S. Cl.
CPC ............... *H01L 33/46* (2013.01); *B82Y 20/00* (2013.01); *H01L 33/08* (2013.01); *Y10S 977/762* (2013.01); *Y10S 977/949* (2013.01); *Y10S 977/95* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,587,005 B2 | 11/2013 | Yoon et al. | |
| 8,735,931 B2 | 5/2014 | Han et al. | |
| 8,766,295 B2 | 7/2014 | Kim | |
| 8,847,265 B2 * | 9/2014 | Lee et al. | 257/98 |
| 2007/0278502 A1 * | 12/2007 | Shakuda et al. | 257/88 |
| 2010/0176375 A1 * | 7/2010 | Lochtefeld | 257/14 |
| 2013/0120967 A1 * | 5/2013 | Liao | 362/97.1 |

FOREIGN PATENT DOCUMENTS

| | | |
|---|---|---|
| KR | 10-2009-0002758 A | 1/2009 |
| KR | 10-2010-0089338 A | 8/2010 |

* cited by examiner

LIGHT-EMITTING DEVICE HAVING DIELECTRIC REFLECTOR AND METHOD OF MANUFACTURING THE SAME

CROSS-REFERENCE TO RELATED APPLICATION

This application is a Continuation of U.S. patent application Ser. No. 13/873,688, filed on Apr. 30, 2013, which claims the priority of Korean Patent Application No. 10-2012-0068171, filed on Jun. 25, 2012, the disclosures of which are incorporated herein in its entirety by reference.

BACKGROUND

The inventive concept relates to a light-emitting device having an omnidirectional dielectric reflector and a method of manufacturing the light-emitting device.

Semiconductor light-emitting devices such as light-emitting diodes (LEDs) or laser diode (LDs) use an electroluminescence phenomenon, that is, light is irradiated from a material (semiconductor) by application of a current or voltage. As electrons and holes are combined in an active layer, that is, a light-emitting layer, of a semiconductor light-emitting device, energy equivalent to an energy band gap of the active layer may be emitted in the form of light. Thus, a wavelength of the light generated from the light-emitting device may vary according to an amount of the energy band gap of the active layer.

A metal reflection film may be formed on a nanorod to improve optical extraction efficiency of a semiconductor light-emitting device having a nanorod structure. However, when a general metal reflection film is formed and light is generated from a quantum well layer of a nanorod light-emitting structure, for example, blue light of a 450 nm wavelength, a refractive index of the metal reflection film is as low as 92%. Further, when a metal reflection film is in use, an excessive leakage current occurs and thus a light-emitting efficiency of a light-emitting device may be reduced.

SUMMARY

In an embodiment, the present inventive concept provides a light-emitting device having a superior performance, and a method of manufacturing the light-emitting device.

In another embodiment, the present inventive concept provides a light-emitting device that effectively restrict a leakage current, and a method of manufacturing the light-emitting device.

In another embodiment, the present inventive concept provides a light-emitting device that includes a high quality gap-filling insulation layer, and a method of manufacturing the light-emitting device.

In another embodiment, the present inventive concept provides a light-emitting device that improves a gap-filling characteristic while preventing deterioration of a light-emitting element, and a method of manufacturing the light-emitting device.

According to an aspect of the present inventive concept, there is provided a light-emitting device including a first conductive semiconductor layer formed on a substrate, a mask layer formed on the first conductive semiconductor layer and having a plurality of holes, a plurality of vertical light-emitting structures vertically grown on the first conductive semiconductor layer through the plurality of holes, a current diffusion layer surrounding the plurality of vertical light-emitting structures on the first conductive semiconductor layer, and a dielectric reflector filling a space between the plurality of vertical light-emitting structures on the current diffusion layer.

In an embodiment, the dielectric reflector includes a plurality of pairs of dielectric layers having different refractive indices.

In another embodiment, the number of pairs of dielectric layers is about 3~15.

In another embodiment, the number of pairs of dielectric layers filling the space between the plurality of vertical light-emitting structures is about 3~10.

In another embodiment, each pair of the plurality of pairs of dielectric layers includes a titanium oxide layer and a silicon oxide layer.

In another embodiment, each of the dielectric layers has a thickness of about 10~50 nm.

In another embodiment, each of the plurality of vertical light-emitting structures has a core-shell structure.

In another embodiment, each of the plurality of vertical light-emitting structures includes a first conductive nanorod vertically grown on the first conductive semiconductor layer through the plurality of holes, and a light-emitting layer and a second conductive semiconductor that sequentially cover the first conductive nanorod. The first conductive nanorod constitutes a core of the core-shell structure, and the light-emitting layer and the second conductive semiconductor constitute a shell of the core-shell structure.

In another embodiment, the light-emitting device further includes an insulation layer surrounding a lower part of each of the plurality of vertical light-emitting structures on the first conductive semiconductor layer.

According to another aspect of the present inventive concept, there is provided a light-emitting device including a first conductive semiconductor layer formed on a substrate, a mask layer formed on the first conductive semiconductor layer and having a plurality of holes, a plurality of pyramid light-emitting structures vertically grown on the first conductive semiconductor layer through the plurality of holes, a current diffusion layer surrounding part of the plurality of pyramid light-emitting structures on the first conductive semiconductor layer, and a dielectric reflector formed on the current diffusion layer.

In an embodiment, the dielectric reflector includes a plurality of pairs of dielectric layers having different refractive indices.

In another embodiment, the number of pairs of dielectric layers is about 3~15.

In another embodiment, each pair of the plurality of pairs of dielectric layers includes a titanium oxide layer and a silicon oxide layer.

In another embodiment, each of the dielectric layers has a thickness of about 10~50 nm.

In another embodiment, each of the plurality of pyramid light-emitting structures includes a first conductive pyramid grown on the first conductive semiconductor layer through the plurality of holes, and a light-emitting layer and a second conductive semiconductor layer that sequentially cover the first conductive pyramid.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
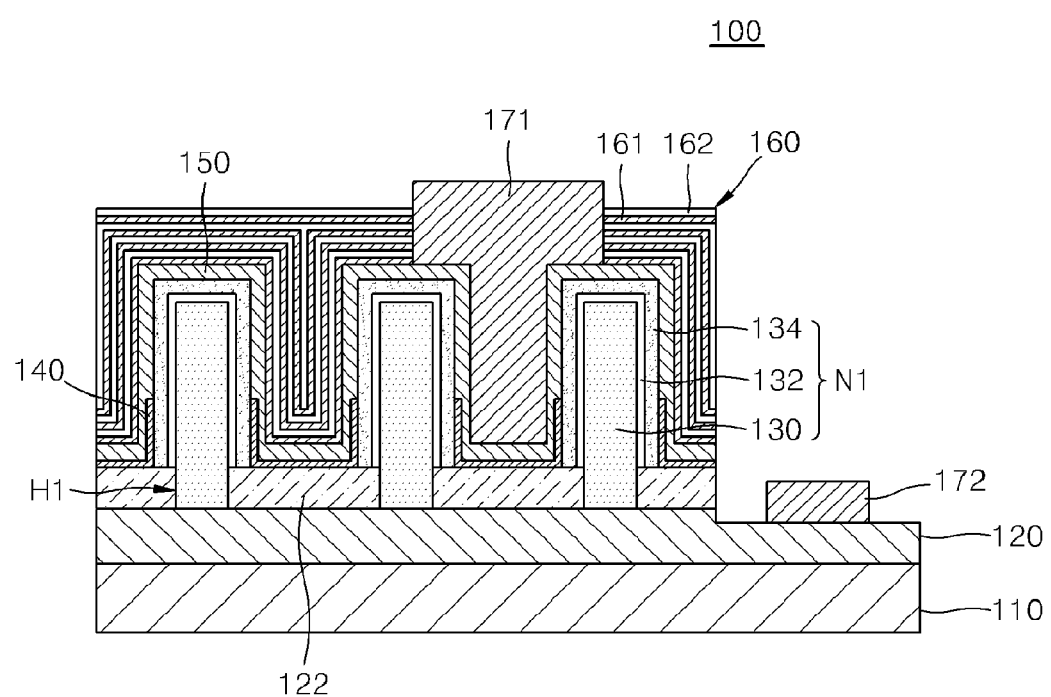
FIG. 1 is a cross-sectional view of a light-emitting device according to an exemplary embodiment of the present inventive concept.

Hereinafter, light-emitting devices having an omnidirectional dielectric reflectors and methods of manufacturing the light-emitting devices according to exemplary embodiments of the present inventive concept are described in detail with reference to the accompanying drawings. Like reference numerals in the drawings denote like elements. In the drawings, the thicknesses of layers and regions are exaggerated for clarity. It will also be understood that when a layer is referred to as being "on" another layer or substrate, it can be directly on the other layer or substrate, or intervening layers may also be present.

FIG. 1 is a cross-sectional view of a light-emitting device 100 according to an exemplary embodiment of the present inventive concept. Referring to FIG. 1, a first conductive semiconductor layer (hereinafter, referred to as the semiconductor layer) 120 is formed on a substrate 110. The semiconductor layer 120 is, for example, formed of n-GaN having a thickness of about 3 μm. The substrate 110 may be any one of various substrates used in a general semiconductor device process. For example, the substrate 110 is any one of a sapphire ($Al_2O_3$) substrate, a Si substrate, a SiC substrate, an AlN substrate, and a Si—Al substrate. However, this is exemplary and other substrates may be used. When a sapphire substrate is used, the sapphire substrate is processed to have a thickness of about 100~170 μm so as to be transparent.

The semiconductor layer 120 is, for example, an n-type semiconductor layer or a p-type semiconductor layer in some embodiments. A mask layer 122 is formed on the semiconductor layer 120. A plurality of holes H1 that expose the semiconductor 120 are formed in the mask layer 122. The mask layer 122 is formed of a predetermined insulation material such as silicon nitride, silicon oxide, or alumina. The diameter of each hole H1 is about 300 nm~1 μm.

A plurality of vertical light-emitting structures N1 is formed on the mask layer 122. The vertical light-emitting structures N1 each is a nanorod or nanowire structure. The vertical light-emitting structures N1 each includes a first conductive semiconductor 130 having a shape of a nanocolumn grown on the semiconductor 120 through the holes H1 corresponding thereto, and an active layer 132 and a second conductive semiconductor 134 that sequentially surround a part of the first conductive semiconductor 130. The vertical light-emitting structures N1 forms a core-shell structure. The first conductive semiconductor 130 is a core of the core-shell structure, whereas the active layer 132 and the second conductive semiconductor 134 constitute a shell of the core-shell structure. The vertical light-emitting structures N1 is formed to have a height of about 1~1.5 μm.

The first conductive semiconductor 130 is of an n-type and the second conductive semiconductor 134 is of a p-type. Alternatively, the first conductive semiconductor 130 is of a p-type and the second conductive semiconductor 134 is of an n-type. The active layer 132 is a "light-emitting layer" that irradiates light as electrons and holes are combined. The first conductive semiconductor 130, the active layer 132, and the second conductive semiconductor 134 may have a variety of structures. For example, at least one of the first conductive semiconductor 130, the active layer 132, and the second conductive semiconductor 134 has a multilayer structure.

The active layer 132 has a structure in which a quantum well layer and a quantum barrier layer are alternately deposited. The first conductive semiconductor 130 and the second conductive semiconductor 134 are formed of n-GaN and p-GaN, respectively. The quantum well layer is formed of InGaN and the quantum bather layer is formed of GaN. The quantum well layer has a single quantum well structure or a multi-quantum well structure.

An insulation layer 140 is provided on the mask layer 122 to surround a lower part of each of the vertical light-emitting structures N1. The insulation layer 140 covers portions of the vertical light-emitting structures N1, except for an upper part of each of the vertical light-emitting structures N1, and an upper surface of the mask layer 122. The insulation layer 140 is formed of silicon nitride, silicon oxide, or alumina.

A current diffusion layer 150 covering the insulation layer 140 and the vertical light-emitting structures N1 is formed on the mask layer 122. The current diffusion layer 150 is a transparent electrode layer and is formed of, for example, conductive oxide such as indium tin oxide (ITO) or conductive polymer. However, the current diffusion layer 150 may be formed of various materials. The insulation layer 140 prevents the current diffusion layer 150 from contacting the first conductive semiconductor 130 or the semiconductor 120.

An omnidirectional dielectric reflector 160 formed of pairs of dielectric layers is formed on the current diffusion layer 150. The omnidirectional reflector 160 is formed as a plurality of pairs of dielectric layers having different refractive indices, for example, pairs of titanium oxide layers 161 and silicon oxide layers 162. Each of the titanium oxide and silicon oxide layers 161 and 162 is formed to have a thickness of about 10~50 nm. When the thickness of each dielectric layer is less than 10 nm, it may be difficult to deposit the dielectric layers. Also, when the thickness of each dielectric layer is greater than 50 nm, it may be difficult to form desired number of pairs of dielectric layers between the neighboring vertical light-emitting structures N1.

The dielectric reflector 160 is formed of, for example, 3~15 pairs of dielectric layers. The number of pairs of dielectric layers filling a space between the neighboring vertical light-emitting structures N1 is about 3~10. As other pairs of dielectric layers are further formed on the vertical light-emitting structures N1, a refractive index is increased. When the number of dielectric layers between the neighboring vertical light-emitting structures N1 is less than three pairs, light reflection efficiency may be lowered. When more than ten pairs of dielectric layers are formed between the neighboring vertical light-emitting structures N1, an area on the substrate 110 occupied by the vertical light-emitting structures N1 may be decreased, thereby reducing the amount of light emitted from the vertical light-emitting structures N1. The dielectric reflector 160 covers top surfaces of the vertical light-emitting structures N1 and fills a space between the neighboring vertical light-emitting structures N1, thereby restricting leakage current.

The dielectric reflector 160 is defined by an etched away portion, and a first electrode 171 is formed in the etched away portion. Thus, the first electrode 171 is electrically connected to the current diffusion layer 150 through the etched away portion. Part of the semiconductor layer 120 is exposed and a second electrode 172 is formed on the semiconductor layer 120.

A predetermined voltage is applied to the vertical light-emitting structures N1 via the first electrode 171 and the second electrode 172. As a result, the vertical light-emitting structures N1 irradiate predetermined light.

In the light-emitting device 100 according to the present exemplary embodiment, since the dielectric reflector 160 formed of pairs of dielectric layers has a refractive index greater than that of a conventional metal film, the dielectric reflector 160 efficiently reflects downwardly the light irradiated from the upper part and a side surface of the light-emitting structure N1. Thus, a light extraction efficiency of the light-emitting device 100 is improved.

Also, the dielectric reflector 160 works as a reflection film and simultaneously restricts leakage current by filling the space between the neighboring vertical light-emitting structures N1 without using a separate insulation layer or protection layer.

FIGS. 2A through 2J are cross-sectional views illustrating a method of manufacturing a light-emitting device 200 having an omnidirectional dielectric reflector 260, according to an exemplary embodiment of the present inventive concept.

Figure 2A:
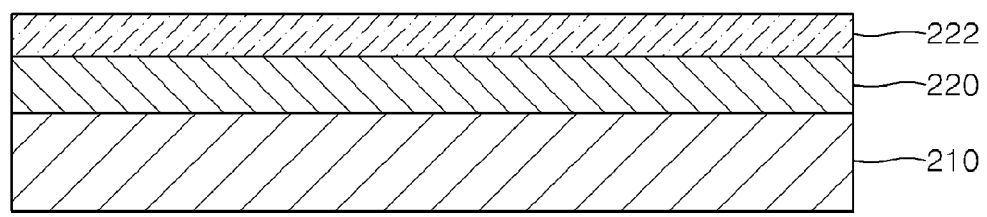
FIGS. 2A through 2J are cross-sectional views illustrating a method of manufacturing a light-emitting device having a dielectric reflector, according to an exemplary embodiment of the present inventive concept.

Referring to FIG. 2A, a first conductive semiconductor layer (hereinafter, referred to as the semiconductor layer) 220 and a mask layer 222 are sequentially formed on a substrate 210. The substrate 210 is any one of various substrates used in a general semiconductor device process. For example, the substrate 210 is any one of a sapphire ($Al_2O_3$) substrate, a Si substrate, a SiC substrate, an AlN substrate, and a Si—Al substrate. However, this is exemplary and other substrates may be used. The substrate 210 is a sapphire substrate having a thickness of about 650 nm. The semiconductor layer 220 is an n-type semiconductor layer, for example, an n-GaN layer having a thickness of about 3 μm. The mask layer 222 is formed of a predetermined insulation material, for example, silicon nitride, silicon oxide, or alumina.

Figure 2B:
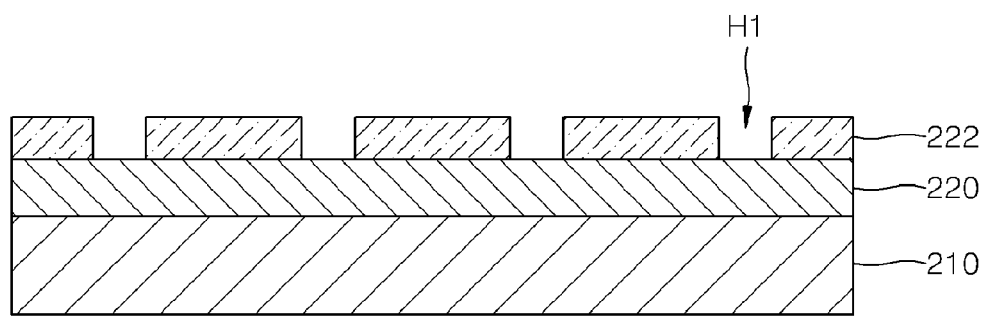

Referring to FIG. 2B, a plurality of holes H1 that expose the semiconductor layer 220 are formed by patterning the mask layer 222. The diameter of each hole H1 is about 300 nm~1 μm.

Figure 2C:
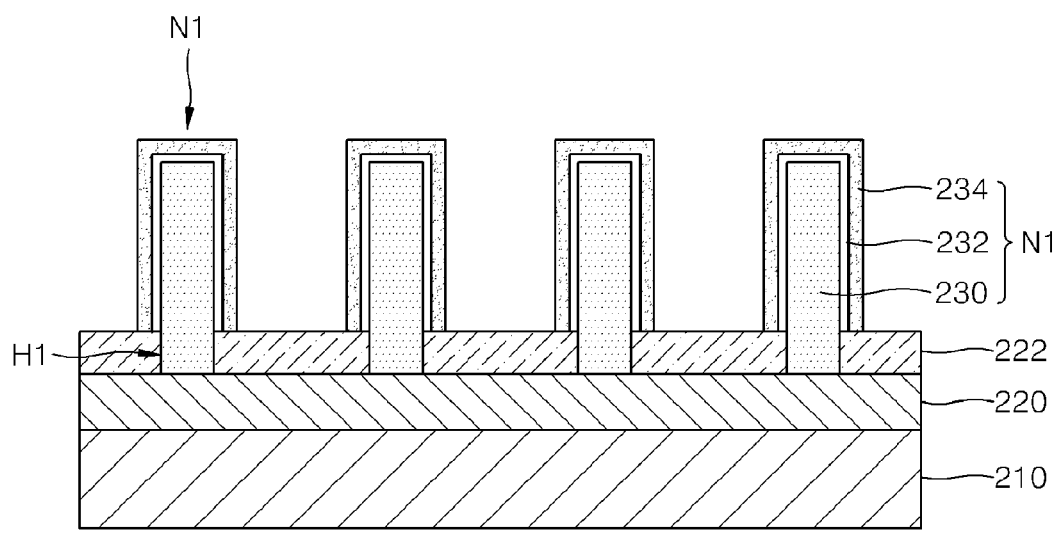

Referring to FIG. 2C, a first conductive semiconductor 230 having a shape of a nanorod or nanowire is grown on the semiconductor layer 220 exposed through the holes H1. The first conductive semiconductor 230 is grown by an epitaxial growing method, for example.

Next, an active layer 232 and a second conductive semiconductor 234 surrounding a part of the first conductive semiconductor 230 are sequentially formed. The first conductive semiconductor 230, the active layer 232, and the second conductive semiconductor 234 constitute a core-shell vertical light-emitting structure N1. The first conductive semiconductor 230 is formed of n-GaN, and the second conductive semiconductor 234 is formed of p-GaN. The active layer 232 irradiates light as electrons and holes are combined.

The active layer 232 has a structure in which a quantum well layer (quantum well) and a quantum barrier layer are alternately deposited. The quantum well layer is formed of InGaN, and the quantum barrier layer is formed of GaN. The active layer 232 has a single quantum well structure or a multi-quantum well structure.

Figure 2D:
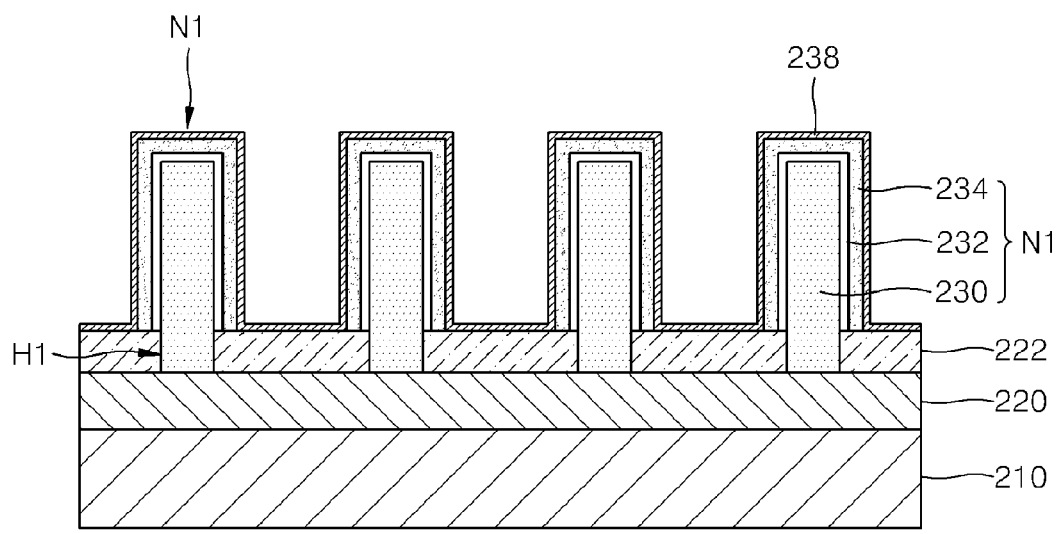

Referring to FIG. 2D, an insulation layer 238 covering the vertical light-emitting structures N1 is deposited on the mask layer 222. The insulation layer 238 is formed by depositing silicon oxide to a thickness of about 100 nm by plasma enhanced CVD (PECVD). The insulation layer 238 may be formed of silicon nitride or alumina.

Figure 2E:
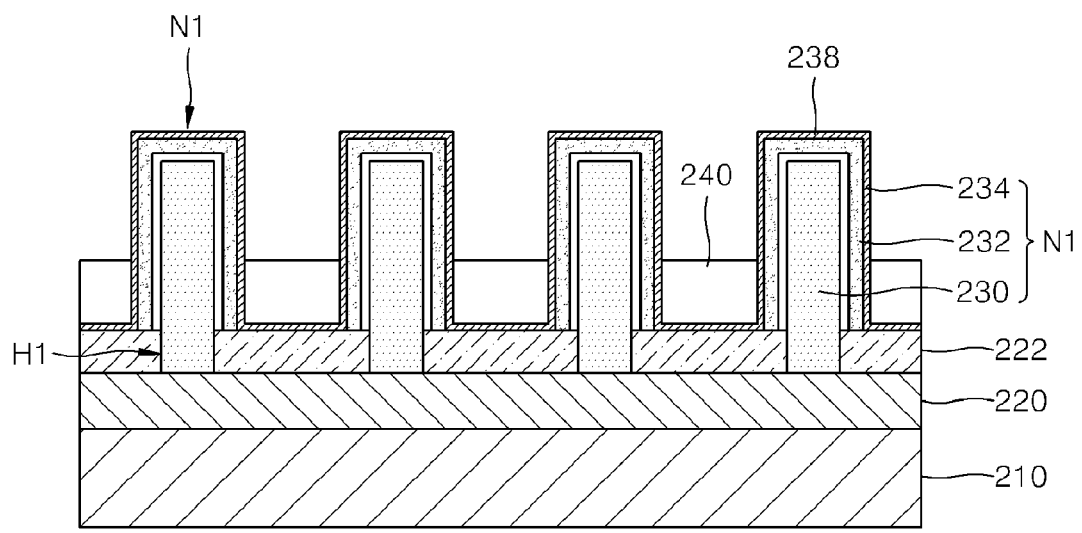

Referring to FIG. 2E, a lower portion of a space between the neighboring vertical light-emitting structures N1 on the insulation layer 238 is spin coated with a polymer layer 240 and thus an upper part of the insulation layer 238 is exposed. The polymer layer 240 is formed of conductive polymer. Spin on glass (SOG) may be coated instead of the polymer layer 240. The SOG may be formed of silicon oxide including boron or phosphor.

Figure 2F:
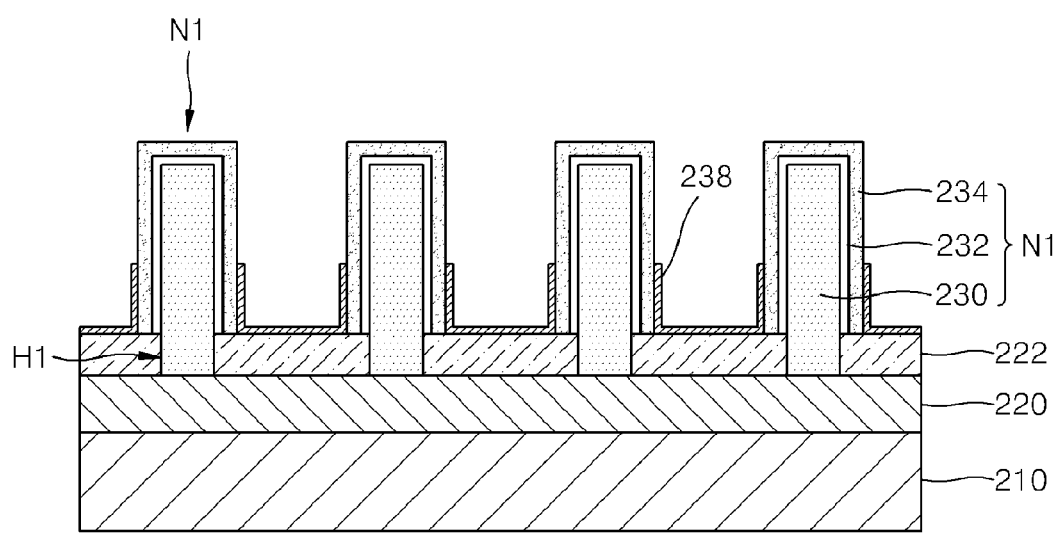

Referring to FIG. 2F, the insulation layer 238 exposed around the polymer layer 240 is removed by a dry etch process or wet etch process. For example, the insulation layer 238 is etched by a reactive ion etching (RIE) method. The RIE may be inductively coupled plasma-RIE (ICP-RIE). In the RIE process, a CF series gas or an SF series gas may be used as an etch gas. For example, $CF_4$ may be used as the CF series gas and $SF_6$ may be used as the SF series gas.

Next, the polymer layer 240 is removed by using a typical dry etch process or wet etch process. For example, an RIE etch method or a buffered oxide etchant (BOE) may be used for the removing of the polymer layer 240.

Figure 2G:
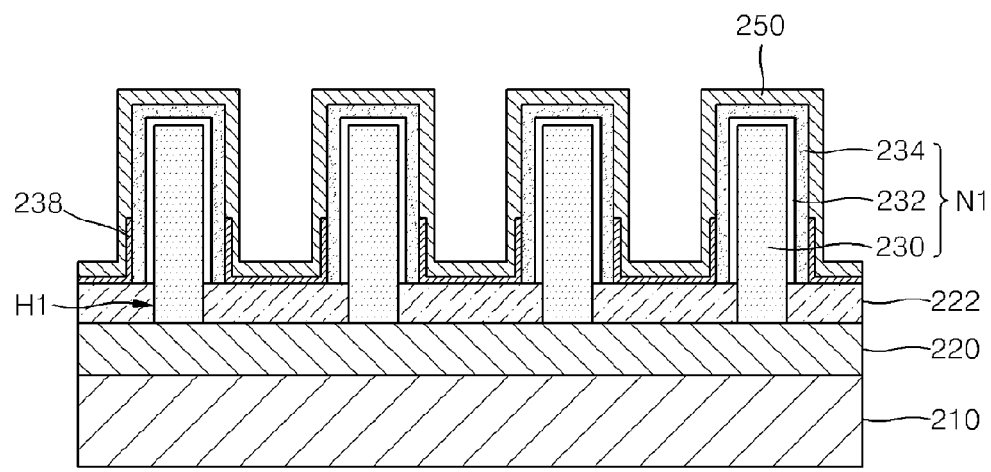

Referring to FIG. 2G, a current diffusion layer 250 covering the second conductive semiconductor 234 is formed on the mask layer 222 by a sputtering process. The current diffusion layer 250 is formed of, for example, conductive oxide such as indium tin oxide (ITO) or conductive polymer. However, the current diffusion layer 250 may be formed of various materials.

Figure 2H:
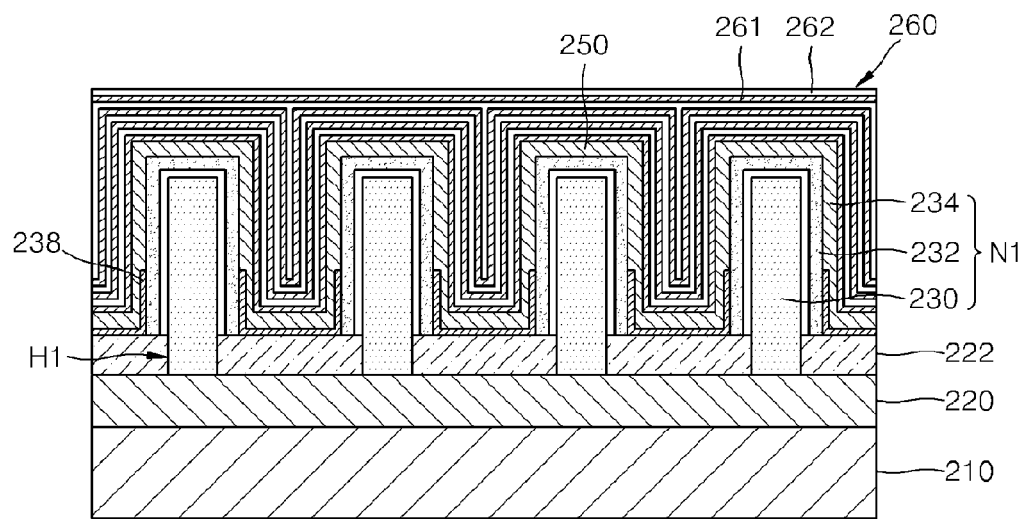

Referring to FIG. 2H, a dielectric reflector 260 is formed on the current diffusion layer 250. The dielectric reflector 260 is formed by alternately depositing materials having different refractive indices, for example, pairs of titanium oxide layers 261 and silicon oxide layers 262. In order to form the dielectric reflector 260, about 3~15 pairs of titanium oxide layers 261 and silicon oxide layers 262 are formed.

About 3~10 dielectric pairs fill a space between the neighboring vertical light-emitting structures N1. The other dielectric pairs are formed above the vertical light-emitting structures N1 so that reflectance is improved. When less than three dielectric pairs are provided between the neighboring vertical light-emitting structures N1, light reflection efficiency may be lowered. When more than ten dielectric pairs are provided between the neighboring vertical light-emitting structures N1, an area on the substrate 110 occupied by the vertical light-emitting structures N1 may be decreased, thereby reducing the amount of light emitted from the vertical light-emitting structures N1. The dielectric reflector 260 has a refractive index of about 100%. Each of the dielectric layers of the dielectric reflector 260 is formed to a thickness of about 10~50 nm. When the thickness of each dielectric layer is less than 10 nm, deposition of the dielectric layers may be difficult. When the thickness is greater than 50 nm, it may be difficult to form desired number of pairs of dielectric layers between the neighboring vertical light-emitting structures N1.

Figure 2I:
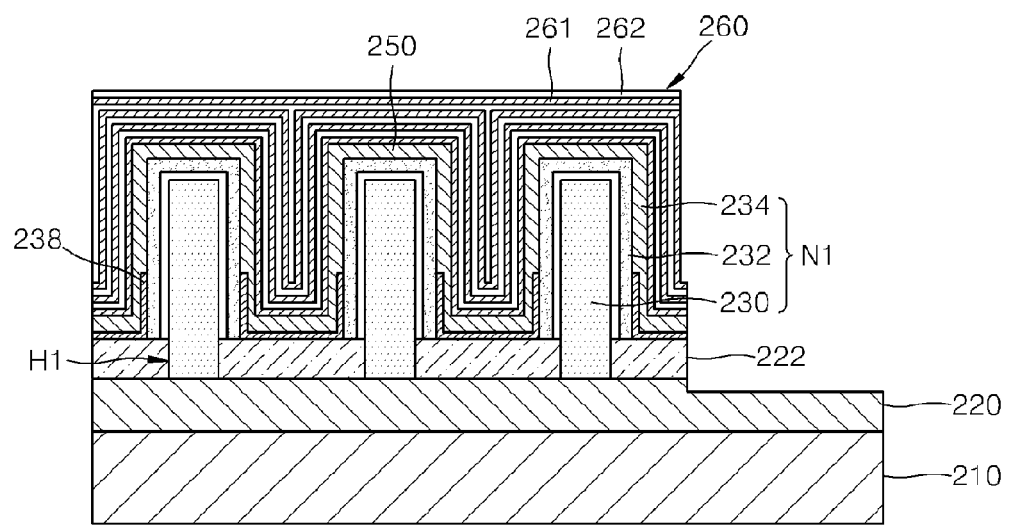

Referring to FIG. 2I, a mask pattern (not shown) having a predetermined opening area is formed on the dielectric reflector 260 and then parts of the dielectric reflector 260, the current diffusion layer 250, the vertical light-emitting structures N1, the insulation layer 238, and the mask layer 222 are etched, thereby exposing part of the semiconductor layer 220.

This etching is referred to as mesa etching. After the mesa etching, the mask pattern is removed.

Figure 2J:
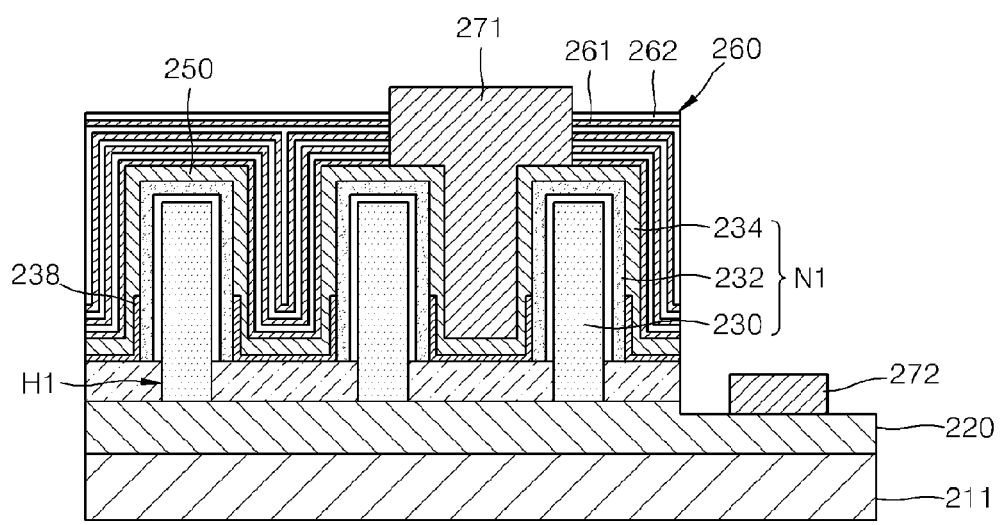

Referring to FIG. 2J, after forming photoresist that exposes part of the dielectric reflector 260 on the dielectric reflector 260, the dielectric reflector 260 in the area exposed by a wet etch process is selectively removed to expose the current diffusion layer 250. A first electrode 271 is formed in the exposed area and a second electrode 272 is formed on the exposed semiconductor layer 220. The first electrode 271 and the second electrode 272 include a metal.

A transparent substrate 211 having a thickness of about 110~170 μm is produced by polishing a lower part of the substrate 210. The light-emitting device 200 is the same as the light-emitting device 100 of FIG. 1.

According to another exemplary embodiment of the present inventive concept, a light-emitting device having the dielectric reflector 260 exhibiting very superior light reflectance is easily manufactured. Also, a manufacturing process is simplified as a process of forming a protection layer for filling a space between neighboring vertical light-emitting structures and a process of forming a reflection film using a metal thin film are replaced by forming the dielectric reflector 260.

Figure 3:
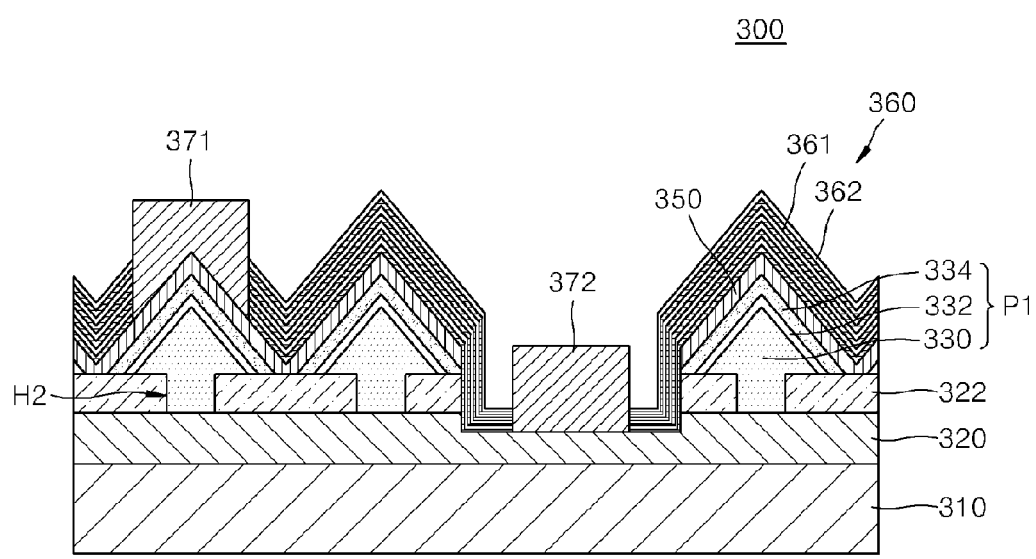
FIG. 3 is a cross-sectional view of a light-emitting device according to an exemplary embodiment of the inventive concept.

FIG. 3 is a cross-sectional view of a light-emitting device 300 according to an exemplary embodiment of the inventive concept. Referring to FIG. 3, a first conductive semiconductor layer (hereinafter, referred to as the semiconductor layer) 320 is formed on a substrate 310. The semiconductor layer 320 is formed of n-GaN having a thickness of about 3 μm. The substrate 310 is any one of various substrates used in a general semiconductor device process. For example, the substrate 310 may be any one of a sapphire ($Al_2O_3$) substrate, a Si substrate, a SiC substrate, an AlN substrate, and a Si—Al substrate. However, this is exemplary and other substrates may be used. When a sapphire substrate is used, the sapphire substrate is processed to have a thickness of about 100~170 μm so as to be transparent.

The semiconductor layer 320 is, for example, an n-type semiconductor layer or a p-type semiconductor layer in some cases. A mask layer 322 is formed on the semiconductor layer 320. A plurality of holes H2 that expose the semiconductor layer 320 are formed in the mask layer 322. The mask layer 322 is formed of a predetermined insulation material such as silicon nitride, silicon oxide, or alumina. The diameter of each hole H2 is about 300 nm~1 μm.

A plurality of pyramid light-emitting structures P1 is formed on the mask layer 322. The pyramid light-emitting structures P1 includes a first conductive semiconductor 330 having a pyramid shape grown on the semiconductor layer 320 through the hole H2 corresponding thereto, and an active layer 332 and a second conductive semiconductor 334 that sequentially surround a part of the first conductive semiconductor 330.

Although the pyramid light-emitting structures P1 are separated from each other in FIG. 3, the present inventive concept is not limited thereto. For example, the first conductive semiconductor 330 may be formed to be continuously connected and the active layer 332 and the second conductive semiconductor 334 may be formed to be continuously connected on the first conductive semiconductor 330. In other words, the pyramid light-emitting structures P1 may be integrally formed.

The pyramid light-emitting structures P1 is formed to have a height of about 500 nm~1 μm.

The first conductive semiconductor 330 is of an n-type and the second conductive semiconductor 334 is of a p-type. Alternatively, the first conductive semiconductor 330 may be of a p-type and the second conductive semiconductor 334 may be of an n-type. The active layer 332 is a "light-emitting layer" that irradiates light as electrons and holes are combined. The first conductive semiconductor 330, the active layer 332, and the second conductive semiconductor 334 may have a variety of structures. For example, at least one of the first conductive semiconductor 330, the active layer 332, and the second conductive semiconductor 334 has a multilayer structure.

The active layer 332 has a structure in which a quantum well layer and a quantum barrier layer are alternately deposited. The first conductive semiconductor 330 and the second conductive semiconductor 334 are formed of n-GaN and p-GaN, respectively. The quantum well layer is formed of InGaN and the quantum bather layer is formed of GaN. The quantum well layer has a single quantum well structure or a multi-quantum well structure.

A current diffusion layer 350 covering the pyramid light-emitting structures P1 is formed on the mask layer 322. The current diffusion layer 350 is a transparent electrode layer and is formed of, for example, conductive oxide such as indium tin oxide (ITO) or conductive polymer. However, the current diffusion layer 350 may be formed of various materials.

An omnidirectional dielectric reflector 360 formed of pairs of dielectric layers is formed on the current diffusion layer 350. The dielectric reflector 360 is formed as pairs of dielectric layers having different refractive indices, for example, pairs of titanium oxide layers 361 and silicon oxide layers 362. Each of the dielectric layers is formed to have a thickness of about 10~50 nm. When the thickness of each dielectric layer is less than 10 nm, it may be difficult to deposit the dielectric layers. Also, when the thickness of each dielectric layer is greater than 50 nm, it may be difficult to form desired number of pairs of dielectric layers between the neighboring pyramid light-emitting structures P1.

The dielectric reflector 360 is formed of, for example, 3~15 pairs of dielectric layers. The dielectric reflector 360 reflects light irradiated from the pyramid light-emitting structures P1. A first electrode 371 is formed on the current diffusion layer 350 that is exposed as part of the dielectric reflector 360 is etched. The dielectric reflector 360, the current diffusion layer 350, and the pyramid light-emitting structures P1 are sequentially etched and thus part of the semiconductor layer 320 is exposed. A second electrode 372 is formed on the exposed semiconductor layer 320.

A predetermined voltage is applied to the pyramid light-emitting structures P1 via the first electrode 371 and the second electrode 372. As a result, the pyramid light-emitting structures P1 irradiates predetermined light.

In the light-emitting device 300 according to the present exemplary embodiment, since the dielectric reflector 360 formed of pairs of dielectric layers has a refractive index greater than that of a conventional metal film, the dielectric reflector 360 efficiently reflects downwardly the light irradiated from the upper part and a side surface of the pyramid light-emitting structures P1. Thus, a light extraction efficiency of the light-emitting device 300 is improved.

Also, the dielectric reflector 360 works as a reflection film and simultaneously restricts leakage current by filling the space between the neighboring pyramid light-emitting structures P1 without using a separate insulation layer or protection layer.

FIGS. 4A through 4H are cross-sectional views illustrating a method of manufacturing a light-emitting device 400 having an omnidirectional dielectric reflector 460, according to an exemplary embodiment of the present inventive concept.

Figure 4A:
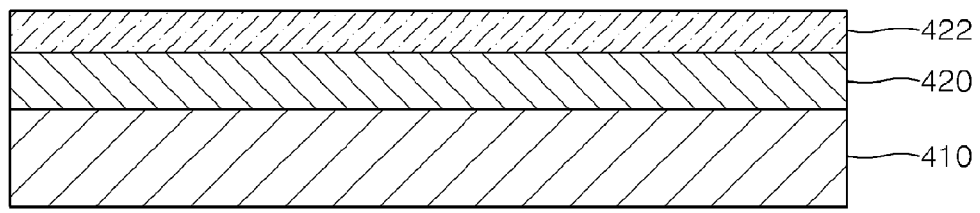
FIGS. 4A through 4H are cross-sectional views illustrating a method of manufacturing a light-emitting device having a dielectric reflector, according to another exemplary embodiment of the present inventive concept.

Referring to FIG. 4A, a first conductive semiconductor layer (hereinafter, referred to as the semiconductor layer) 420 and a mask layer 422 are sequentially formed on a substrate 410. The substrate 410 is any one of various substrates used in a general semiconductor device process. For example, the substrate 410 is any one of a sapphire ($Al_4O_3$) substrate, a Si substrate, a SiC substrate, an AlN substrate, and a Si—Al substrate. However, this is exemplary and other substrates may be used. The substrate 410 may be a sapphire substrate having a thickness of about 650 μm. The semiconductor layer 420 is an n-type semiconductor layer, for example, an n-GaN layer having a thickness of about 3 μm. The mask layer 422 is formed of a predetermined insulation material, for example, silicon nitride, silicon oxide, or alumina.

Figure 4B:
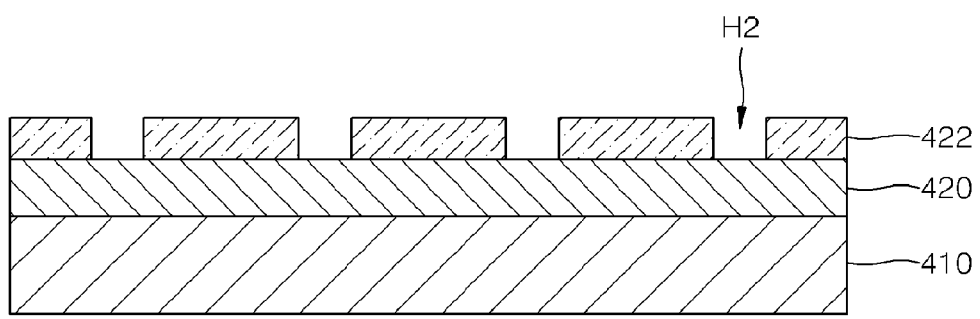

Referring to FIG. 4B, a plurality of holes H2 that expose the semiconductor layer 420 are formed by patterning the mask layer 422. The diameter of each hole H2 is about 300 nm~1 μm.

Figure 4C:
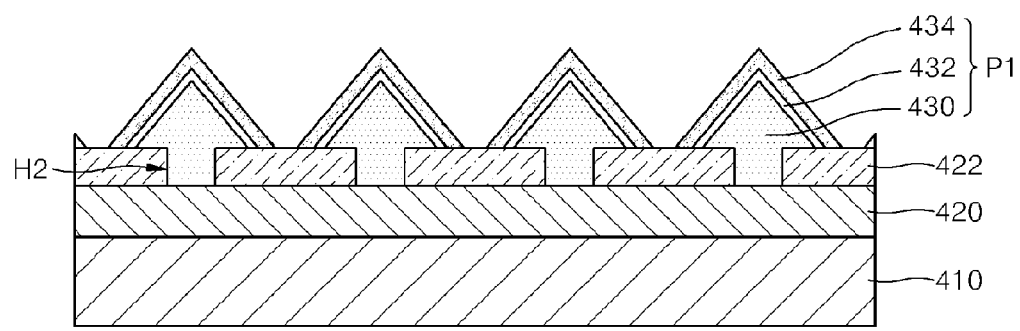

Referring to FIG. 4C, a first conductive semiconductor 430 having a shape of a pyramid is grown on the semiconductor layer 420 exposed through the holes H2. The first conductive semiconductor 430 is grown by an epitaxial growing method, for example. When the first conductive semiconductor 430 is grown at a relatively low temperature, for example, about 900~950° C., and a relatively high pressure under nitrogen atmosphere, pyramid growth is generated as lateral growth is generated with vertical growth.

Next, an active layer 432 and a second conductive semiconductor 434 surrounding part of the first conductive semiconductor 430 are sequentially formed. The first conductive semiconductor 430, the active layer 432, and the second conductive semiconductor 434 constitute each of the pyramid light-emitting structures P1. The first conductive semiconductor 430 is formed of n-GaN and the second conductive semiconductor 434 is formed of p-GaN. The active layer 432 irradiates light as electrons and holes are combined.

The active layer 432 has a structure in which a quantum well layer and a quantum barrier layer are alternately deposited. The quantum well layer is formed of InGaN and the quantum barrier layer is formed of GaN. The active layer 432 has a single quantum well structure or a multi-quantum well structure.

Figure 4D:
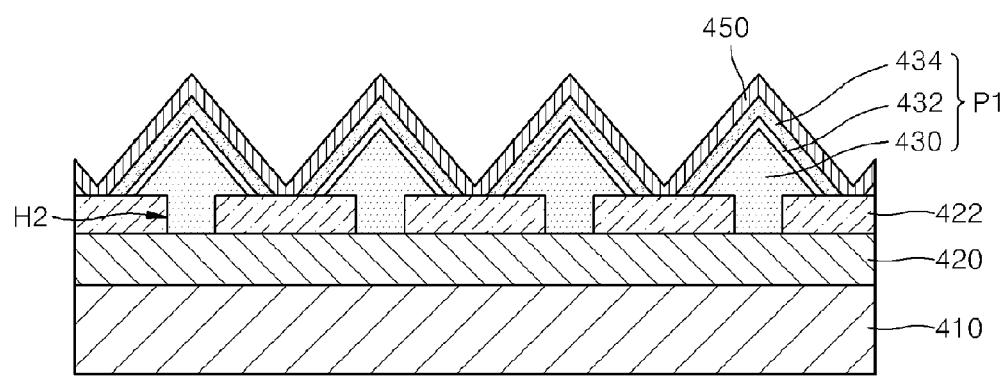

Referring to FIG. 4D, a current diffusion layer 450 covering the second conductive semiconductor 434 is formed on the mask layer 422 by a sputtering process. The current diffusion layer 450 is formed of, for example, conductive oxide such as indium tin oxide (ITO) or conductive polymer. However, the current diffusion layer 450 may be formed of various materials.

Figure 4E:
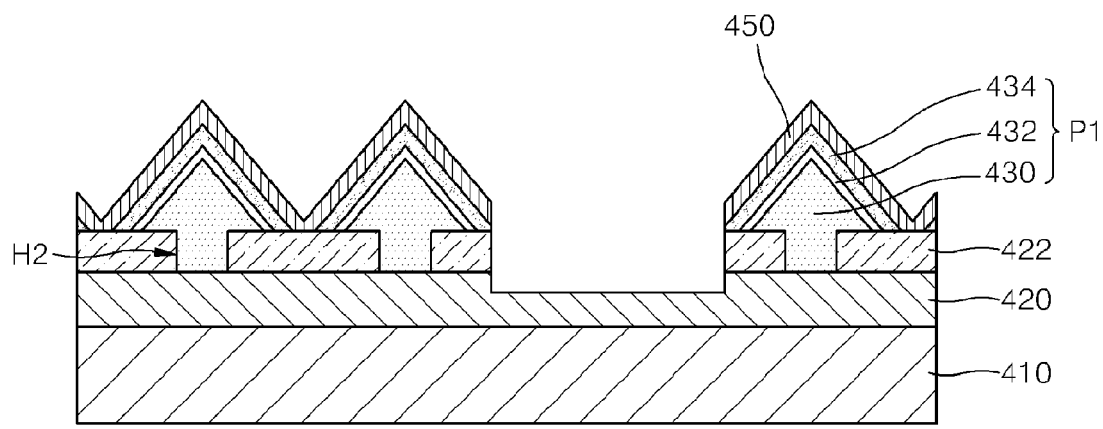

Referring to FIG. 4E, a mask pattern (not shown) having a predetermined opening area is formed on the current diffusion layer 450 and then parts of the current diffusion layer 450, the pyramid light-emitting structures P1, and the mask layer 422 are etched by using the mask pattern as an etch barrier, thereby exposing part of the semiconductor layer 420. After the etching, the mask pattern is removed.

Figure 4F:
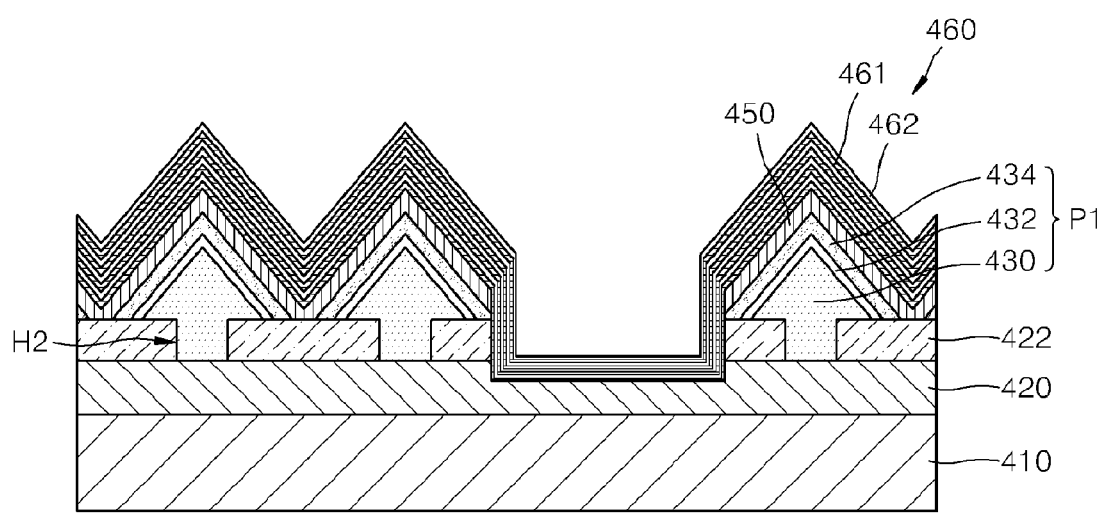

Referring to FIG. 4F, the dielectric reflector 460 is formed on the current diffusion layer 450. The dielectric reflector 460 is formed by alternately depositing materials having different refractive indices, for example, pairs of titanium oxide layers 461 and silicon oxide layers 462. The dielectric reflector 460 is formed in about 3~15 pairs of the titanium oxide 461 and the silicon oxide 462. The dielectric reflector 460 has a refractive index of about 100%. Each of the dielectric layers of the dielectric reflector 460 is formed to a thickness of about 10~50 nm. When the thickness of each dielectric layer is less than 10 nm, deposition of the dielectric layers may be difficult. When the thickness is greater than 50 nm, it may be difficult to form a desired number of pairs of dielectric layers between the neighboring pyramid light-emitting structures P1.

Figure 4G:
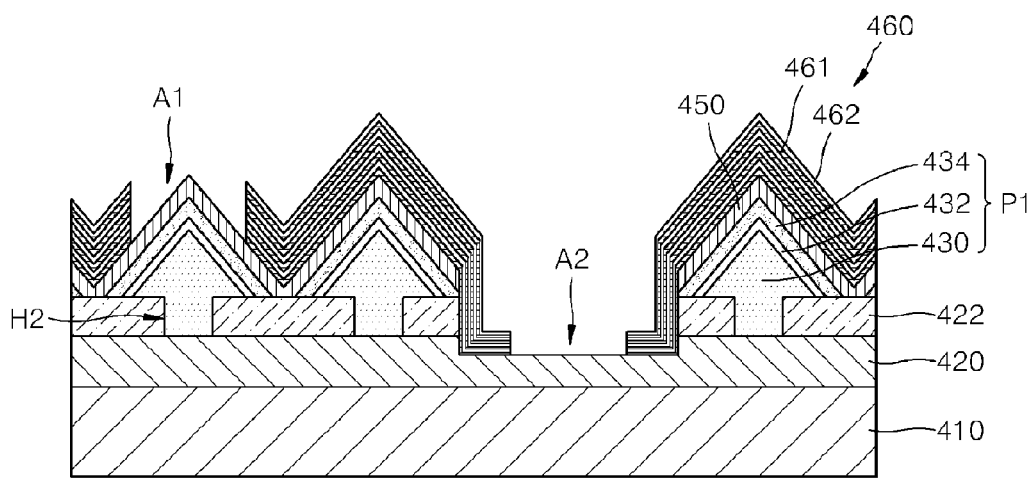

Referring to FIG. 4G, a mask pattern (not shown) having a predetermined opening area is formed on the dielectric reflector 460 and then parts of the dielectric reflector 460 is etched by using the mask pattern as an etch barrier, thereby forming a first area A1 that exposes the current diffusion layer 450. After the etching, the mask pattern is removed.

Figure 4H:
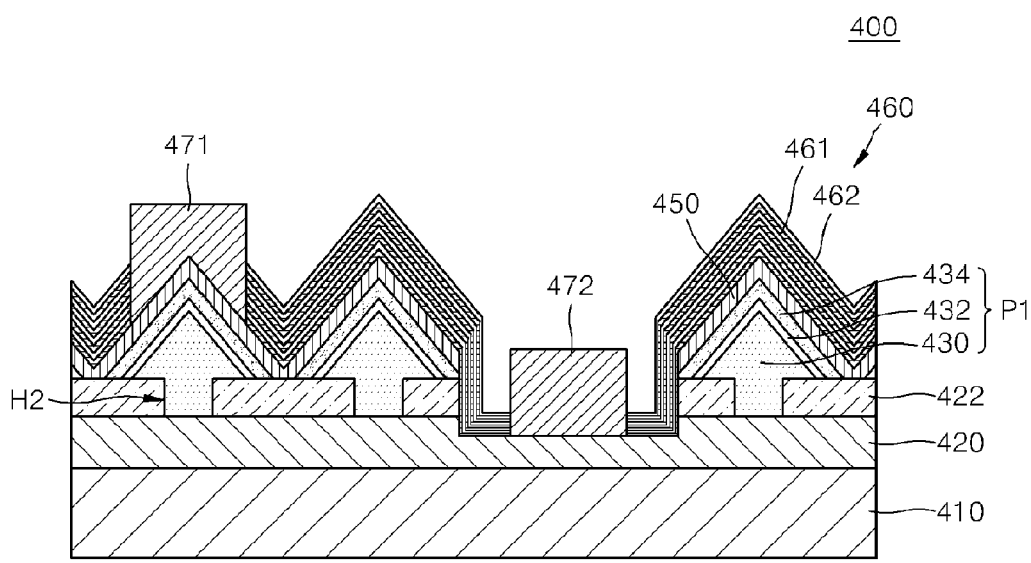

Referring to FIG. 4H, a first electrode 471 is formed in the exposed area A1 where the current diffusion layer 450 is exposed and a second electrode 472 is formed in a second area A2 where the semiconductor layer 420 is exposed. The first electrode 471 and the second electrode 472 is formed of predetermined metal.

A transparent substrate 411 having a thickness of about 110~170 μm is produced by polishing a lower part of the substrate 410. A resultant light-emitting device 400 is the same as the light-emitting device 300.

According to another exemplary embodiment of the present inventive concept, a light-emitting device having a dielectric reflector exhibiting very superior light reflectance is easily manufactured.

As described above, in the light-emitting device according to the present inventive concept, since the reflectance of a dielectric reflector is greater than that of a conventional metal film, light irradiated from the upper part and side surface of a nano light-emitting structure is effectively and downwardly reflected and thus a light extraction efficiency of a light-emitting device is improved.

Also, since the dielectric reflector fills between nano light-emitting structures without using a separate insulation layer or protection layer while performing a reflection film, leakage current is restricted.

While the inventive concept has been particularly shown and described with reference to exemplary embodiments thereof, it will be understood that various changes in form and details may be made therein without departing from the spirit and scope of the following claims.

What is claimed is:

1. A light-emitting device comprising:
a first conductive semiconductor layer disposed on a substrate;
a mask layer disposed on the first conductive semiconductor layer and having a plurality of holes, each of the plurality of holes having a diameter of about 300 nm~1 μm;
a plurality of first conductive nanorods vertically grown on the first conductive semiconductor layer through the plurality of holes;
a light-emitting layer and a second conductive semiconductor layer sequentially covering the plurality of first conductive nanorods on the first conductive semiconductor layer;
a current diffusion layer surrounding the second conductive semiconductor layer on the first conductive semiconductor layer; and
a dielectric reflector filling a space between the plurality of first conductive nanorods on the current diffusion layer.

2. The light-emitting device of claim 1, further comprising an insulation layer surrounding the second conductive semiconductor layer.

3. The light-emitting device of claim 1, wherein the substrate is a transparent substrate, and has a thickness of about 100~170 μm.

4. The light-emitting device of claim 1, wherein the dielectric reflector comprises a structure in which two dielectric layers having different refractive indices are alternatively deposited.

5. The light-emitting device of claim 1, wherein the dielectric reflector comprises a plurality of pairs of a titanium oxide layer and a silicon oxide layer.

6. The light-emitting device of claim 1, wherein the dielectric reflector comprises a plurality of dielectric layers, each of the plurality of dielectric layers having a thickness of about 10~50 nm.

7. The light-emitting device of claim 1, wherein the dielectric reflector comprises a plurality of pairs of dielectric layers, and the number of pairs of dielectric layers is about 3~15.

8. The light-emitting device of claim 1, wherein the current diffusion layer is a transparent electrode layer.

9. The light-emitting device of claim 1, wherein the current diffusion layer is formed of indium tin oxide.

10. The light-emitting device of claim 1, wherein the current diffusion layer is formed of conductive oxide or conductive polymer.

* * * * *